(12) United States Patent
Kim et al.

(10) Patent No.: US 7,989,792 B2
(45) Date of Patent: Aug. 2, 2011

(54) ABRUPT METAL-INSULATOR TRANSITION DEVICE WITH PARALLEL MIT MATERIAL LAYERS

(75) Inventors: Hyun-Tak Kim, Daejeon (KR);
Byung-Gyu Chae, Daejeon (KR);
Kwang-Yong Kang, Daejeon (KR);
Bong-Jun Kim, Daejeon (KR);
Yong-Wook Lee, Daejeon (KR);
Sun-Jin Yun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 449 days.

(21) Appl. No.: 12/162,964

(22) PCT Filed: Jan. 31, 2007

(86) PCT No.: PCT/KR2007/000526
§ 371 (c)(1),
(2), (4) Date: Jul. 31, 2008

(87) PCT Pub. No.: WO2007/089097
PCT Pub. Date: Aug. 9, 2007

(65) Prior Publication Data
US 2009/0057820 A1    Mar. 5, 2009

(30) Foreign Application Priority Data

Feb. 1, 2006   (KR) .................. 10-2006-0009827
Jun. 23, 2006  (KR) .................. 10-2006-0057086

(51) Int. Cl.
*H01L 49/00* (2006.01)
(52) U.S. Cl. .................. 257/2; 257/4; 257/E29.002
(58) Field of Classification Search .............. 257/2, 4, 257/536, E29.002
See application file for complete search history.

(56) References Cited

U.S. PATENT DOCUMENTS

| 6,121,642 A | 9/2000 | Newns |
| 6,365,913 B1 | 4/2002 | Misewich et al. |
| 6,624,463 B2 * | 9/2003 | Kim et al. ............. 257/310 |
| 6,801,676 B1 | 10/2004 | Liu |

(Continued)

FOREIGN PATENT DOCUMENTS

| CN | 1722489 A | 1/2006 |
| KR | 10-2006-0006195 | 1/2006 |

(Continued)

OTHER PUBLICATIONS

Liu et al., "A high-speed silicon optical modulator based on a metal-oxide-semiconductor capacitor", Nature, vol. 427, Feb. 12, 2004, pp. 615-618.

Xu et al., "Micrometre-scale silicon electro-optic modulator", Nature, vol. 435, May 19, 2005, pp. 325-327.

(Continued)

*Primary Examiner* — Evan Pert
(74) *Attorney, Agent, or Firm* — Rabin & Berdo, P.C.

(57) ABSTRACT

An abrupt MIT (metal-insulator transition) device with parallel MIT material layers is provided. The abrupt MIT device includes a first electrode disposed on a certain region of a substrate, a second electrode disposed so as to be spaced a predetermined distance apart from the first electrode, and at least one MIT material layer electrically connecting the first electrode with the second electrode and having a width that allows the entire region of the MIT material layer to be transformed into a metal layer due to an MIT. Due to this configuration, deterioration of the MIT material layer, which is typically caused by current flowing through the MIT material layer, is less likely to occur.

18 Claims, 5 Drawing Sheets

U.S. PATENT DOCUMENTS

| | | |
|---|---|---|
| 6,890,766 B2 | 5/2005 | Doderer et al. |
| 6,933,553 B2 | 8/2005 | Kim et al. |
| 6,987,290 B2 * | 1/2006 | Kim et al. .................. 257/173 |
| 7,408,217 B2 * | 8/2008 | Yoon et al. .................. 257/310 |
| 7,489,492 B2 * | 2/2009 | Kim et al. .................. 361/111 |

FOREIGN PATENT DOCUMENTS

WO    WO 2005/041308 A1 *   5/2005

* cited by examiner

ABRUPT METAL-INSULATOR TRANSITION DEVICE WITH PARALLEL MIT MATERIAL LAYERS

CROSS-REFERENCE TO RELATED PATENT APPLICATION

This application claims the benefit of Korean Patent Application No. 10-2006-0009827, filed on Feb. 1, 2006, and Korean Patent Application No. 10-2006-0057806, filed on Jun. 23, 2006, in the Korean Intellectual Property Office, the disclosure of which is incorporated herein in its entirety by reference.

BACKGROUND OF THE INVENTION

1. Field of the Invention

The present invention relates to a device using a metal-insulator transition (MIT) effect, and more particularly, to a device using an abrupt MIT material as a conductor whose phase can be transformed into a metal.

2. Description of the Related Art

As is generally known, an MIT occurs at a Mott insulator and a Hubbard insulator. The Hubbard insulator is a consecutive MIT. A field effect transistor (FET) that uses the Hubbard insulator as a channel layer was introduced in an article by D. M. Newns et al., *Appl. Phys. Lett.*, vol. 73, p. 780, 1998. Since the Hubbard insulator uses an MIT that occurs consecutively, charges to be used as a carrier need to be added consecutively until an excellent metallic characteristic is achieved.

An article by Hyun-Tak Kim, *NATO Science Series* Vol. II/67, Kluwer, p. 137, 2002, which is also described on the web site http://xxx.lanl.gow/abs/cond-mat/0110112, teaches a theory that supports an abrupt MIT due to the Mott insulator. According to the theory in the above article, the Mott insulator has a bounded and metallic electron structure. Energy between electrons of the Mott insulator is made to change, and thus, an insulator-to-metal transition does not occur consecutively; rather it occurs abruptly. Changing temperature, pressure or an electric field instigates the energy change between the electrons of the Mott insulator. For instance, when holes with a low doping density are added to the Mott insulator, the insulator-to-metal transition occurs abruptly or suddenly.

Figure 1:
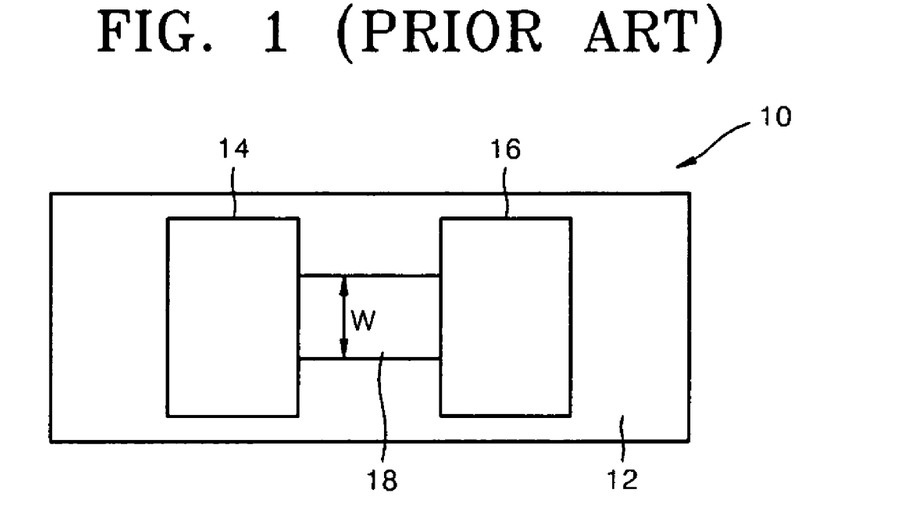
FIG. 1 illustrates a top view of a typical MIT device including two terminals configured in a horizontal structure.

In a typical abrupt MIT device, when an inconsecutive MIT occurs, a large amount of current flows abruptly. Thus, an MIT material layer is more likely to be deteriorated. FIG. 1 illustrates a top view of a typical MIT device 10.

The typical MIT device 10 includes a pair of electrodes 14 and 16 arranged to be spaced a predetermined distance apart from each other on certain regions of a substrate 12. An MIT material layer is disposed between the pair of the electrodes 14 and 16. The MIT material layer makes an electric connection between the electrodes 14 and 16 and causes an abrupt MIT. The abrupt MIT causes the MIT material layer to be transformed into a metal layer. Hence, the MIT material layer can be used as an MIT material layer 18. The MIT material layer 18 has a width of 'W'.

Figure 2:
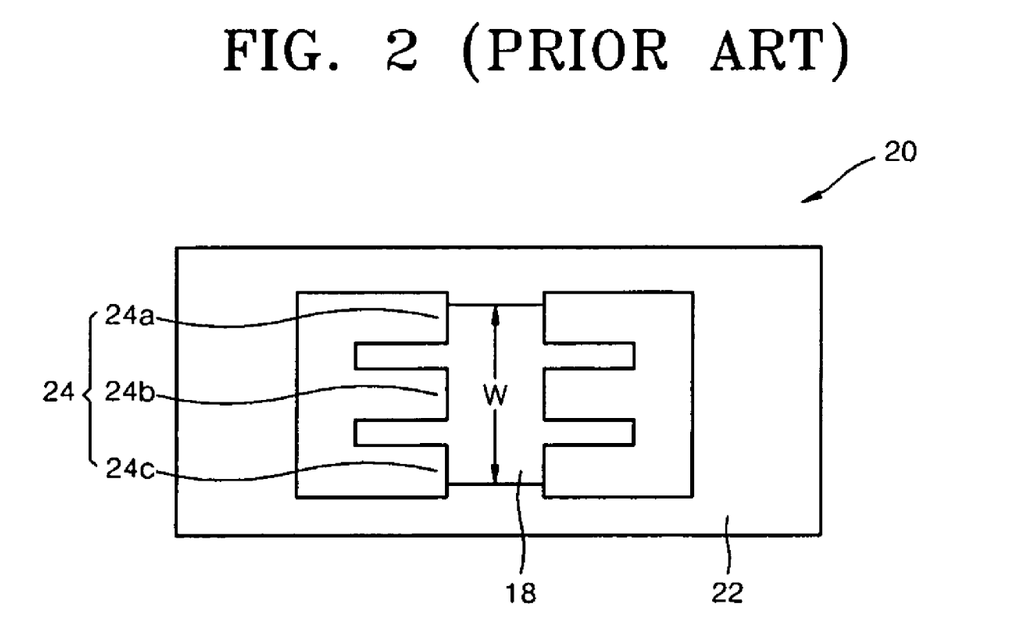
FIG. 2 illustrates a top view of a sample analyzed by micro-Raman spectroscopy to check structural uniformity of an MIT material layer of a typical MIT device.
Figure 3:
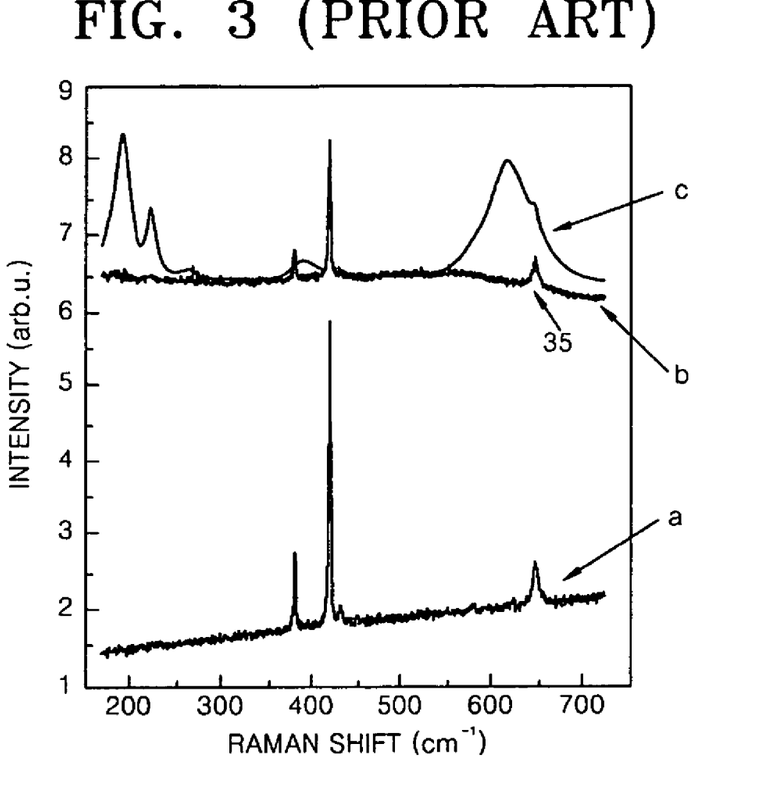
FIG. 3 illustrates a graph of the intensity as a function of the Raman shift for the MIT material layer illustrated in FIG. 2.

FIG. 2 illustrates a top view of a sample 20 analyzed by micro-Raman spectroscopy to check structural uniformity of the MIT material layer 18 of the typical MIT device 10 (FIG. 1). FIG. 3 illustrates a graph of the intensity as a function of the Raman shift for the MIT material layer 18 illustrated in FIG. 2. As is well known, Raman spectroscopy is used to observe vibration energy of lattices. For metal, a peak is not observed. The width W of the MIT material layer 18 is exaggerated for clarity.

The sample 20 includes the MIT material layer 18 disposed on a support 22 and an analytical electrode 24 segmented into a certain number of regions and contacting the MIT material layer 18. For instance, the analytical electrode 24 is segmented into three regions including an upper region 24A, a central region 24B and a lower region 24C and has a protruding structure. In FIG. 3, the intensity as a function of the Raman shift, which is typically reported in units of $cm^{-1}$, shows the characteristics of a substrate, more particularly, a region a representing $Al_2O_3$, and regions b and c measured when a large amount of current, e.g., a current amount of 'F' as marked in FIG. 8, flows through the MIT material layer 18. The curvature regions b and c are the measurements at the central region 24B (see FIG. 2) and at the upper and lower regions 24A and 24C (see FIG. 2), respectively. Reference numeral 35 represents a peak indicating $Al_2O_3$. Scattered Raman peaks indicate that a phase of the MIT material layer 18 is not yet transformed into a metal state. Therefore, the MIT does not yet take place at the upper region 24A and the lower region 24C, and continues to remain in an insulator state. The central region 24B has a phase transition to metal. The MIT material layer 18 that includes an insulator region after the MIT is called a non-uniform MIT material layer. However, an MIT material to be used as the MIT material layer 18 usually needs to be uniform. That is, the MIT material layer 18 needs to be a uniform MIT material layer that is entirely transformed into a metal layer after the MIT.

Due to several limitations in typical fabrication methods, the MIT material layer is often non-uniform in actual industrial practice. For instance, the inventors of this patent application reported this exemplary case in *New J. Phys.* Vol. 6, p. 52, 2004. It was experimentally verified that the MIT material layer 18 after the MIT was easily deteriorated due to the non-uniformity characteristic. In detail, the non-uniform MIT material layer 18 was easily deteriorated due to heat generated by a large amount of current.

In order to implement an MIT in other application fields, a large amount of current needs to flow uniformly after a phase transition from an insulator to a metal occurs. Hence, it is generally essential to develop a uniform MIT material layer. A method of reducing the deterioration of an MIT material layer when current flows through an MIT device has not yet been developed.

SUMMARY OF THE INVENTION

The present invention provides an abrupt MIT device that can reduce deterioration of an MIT material layer when current flows through the MIT material layer.

According to an aspect of the present invention, there is provided an abrupt MIT device, including a first electrode disposed on a certain region of a substrate, a second electrode disposed so as to be spaced a predetermined distance apart from the first electrode, and at least one MIT material layer electrically connecting the first electrode with the second electrode and having a width that allows the entire region of the MIT material layer to be transformed into a metal layer due to an MIT.

The abrupt MIT device may further include a gate electrode configured to extend over a certain region of the MIT material layer and have a gate insulation layer interposed between the MIT material layer and the gate electrode. The MIT material layer, the first electrode and the second electrode may be configured to become parts of a protection circuit. The abrupt MIT device may further include an electrical system connected in parallel with the protection circuit.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals denote like elements even in different drawings.

An MIT material layer that is entirely transformed into a metal layer due to an MIT and MIT devices using the MIT material layer according to various embodiments of the present invention will be described below in detail. The MIT material layer has a path where current can flow, and in particular, MIT material layers according to various embodiments of the present invention can be transformed into a metal layer across their entire width. As described in FIG. 3, the MIT material layer does not have the scattered Raman peak, and more particularly, current needs to flow uniformly to the MIT material layer.

The MIT material layer according to various embodiments of the present invention includes a material that can undergo an abrupt MIT. Thus, a device using the MIT material layer can be referred as to an MIT device. The MIT device can be modified into various forms within the scope and sprit of the present invention. The illustrated MIT devices are exemplary embodiments.

Figure 4:
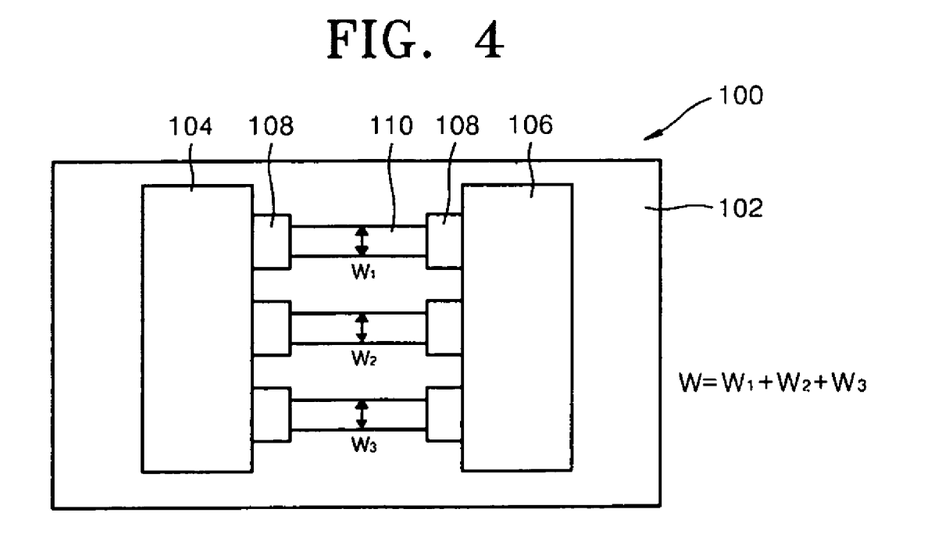
FIG. 4 illustrates a top view of an MIT device including two terminals configured in a horizontal structure, according to an embodiment of the present invention.

FIG. 4 illustrates a top view of an MIT device 100 including two terminals configured in a horizontal structure according to an embodiment of the present invention.

As illustrated, at least one MIT material layer 110 is disposed between a first electrode 104 and a second electrode 106 that are arranged so as to be spaced a predetermined distance apart from each other over certain regions of a substrate 102. The MIT material layer 110 makes an electric connection between the first electrode 104 and the second electrode 106, and in the present embodiment, multiple MIT material layers 110 are formed. Each of the MIT material layers 110 has a region having a width $W_1$, $W_2$ or $W_3$, at which the individual MIT material layers 110 can be transformed into metal layers due to an MIT. If there are multiple MIT material layers 110, the MIT material layers 110 may be electrically connected in parallel. Although not illustrated, a buffer layer may further be disposed between the substrate 102 and the MIT material layer 110. The buffer layer may be disposed over the entire substrate 102.

The MIT material layer 110 may include one selected from a group consisting of an inorganic compound semiconductor and an insulator, an organic semiconductor and an insulator, a semiconductor, and an oxide-based semiconductor and an insulator. The inorganic compound semiconductor includes one selected from a group consisting of oxygen, carbon, semi-conductive elements from groups III to V or groups II to VI, transition metal elements, rare-earth elements, and lanthanum-based elements, and holes with a low doping density are added thereto. Holes with a low doping density are also added to the organic semiconductor, and the insulator the semiconductor, and the oxide-based semiconductor and the insulator.

The entire region of the MIT material layer 110 having the set width is transformed into a metal layer, and thus, the Raman peak is not observed. Also, current needs to flow uniformly throughout the MIT material layer 110. If the current flow is uniform throughout the MIT material layer 110, heat generation caused by resistance can be reduced. As a result, the MIT material layer 110 can be formed more stably.

The current flowing through the MIT material layer 110 is substantially the same as the sum of the areas of the multiple MIT material layers 110, and the amount of current may be at least two times larger than that of the current flowing through the MIT material layer 18 that has the Raman peak as described in FIG. 3. For instance, assuming that one MIT material layer including the Raman peak (i.e., the non-uniform MIT material layer) has a width W, this MIT material layer can be segmented into multiple MIT material layers 110, each having a width $W_1$, $W_2$ or $W_3$ as described in the present embodiment. Although FIG. 3 illustrates three MIT material layers 110, which are uniform MIT material layers, as an example, various numbers of MIT material layers 110 may be formed as need requires. The MIT material layer 110 according to the present embodiment is a uniform conductor after the MIT. Thus, a larger current amount can flow thereto as compared with the current amount flowing to the typical non-uniform MIT material layer. A parallel connection of the multiple MIT material layers 110 allows a current flow to increase to a greater extent.

Each of the first electrode 104 and the second electrode 106 may include one selected from a group consisting of a metal group, a compound of metals selected from the metal group, and an oxide-based material including one metal from the metal group and the compound. The metal group includes Li, Be, C, Na, Mg, Al, K, Ca, Sc, Ti, V, Cr, Mn, Fe, Co, Ni, Cu, Zn, Ga, Rb, Sr, Y, Zr, Nb, Mo, Tc, Ru, Rh, Pd, Ag, Cd, In, Sn, Sb, Cs, Ba, La, Hf, Ta, W, Re, Os, Ir, Pt, Au, Hg, Pb, Bi, Po, Ce, Pr, Nd, Sm, Eu, Gd, Tb, Dy, Ho, Er, Tm, Yb, Lu, Th, U, Np, and Pu.

A protection electrode 108 being resistant to heat, which may be generated by current flowing to the MIT material layer 110, may be further formed between the MIT material layer 110 and the first electrode 104 and between the MIT material layer 110 and the second electrode 106. Since the MIT material layer 110 illustrated in FIG. 1 may be realised as multiple MIT material layers 110, multiple protection electrodes 108 may also be formed. The protection electrode 108 may include one selected from a group consisting of a metal group, a compound of metals selected from the metal group, and an oxide-based material including one metal from the metal group and the compound. The metal group includes Li, Be, C, Na, Mg, Al, K, Ca, Sc, Ti, V, Cr, Mn, Fe, Co, Ni, Cu, Zn, Ga, Rb, Sr, Y, Zr, Nb, Mo, Tc, Ru, Rh, Pd, Ag, Cd, In, Sn, Sb, Cs, Ba, La, Hf, Ta, W, Re, Os, Ir, Pt, Au, Hg, Pb, Bi, Po, Ce, Pr, Nd, Sm, Eu, Gd, Tb, Dy, Ho, Er, Tm, Yb, Lu, Th, U, Np, and Pu.

Although the substrate 102 is not limited to a specific material, the substrate 102 may include one selected from a group consisting of an organic layer, an inorganic layer, at least one multi-layer including multiple layers of the organic layer and the inorganic layer, and a patterned structure thereof. For instance, the substrate 102 may be formed using various materials such as single crystal sapphire, silicon, glass, quartz, compound semiconductors, and plastic materials. In the case of using glass or plastic materials, a reaction temperature is limited. Using a plastic material allows the substrate 102 to be flexible. Silicon, glass and quartz are advantageous when the substrate 102 is required to have a diameter of 8 inches or more. The substrate 102 may also have a silicon on insulator (SOI) structure to satisfy the requirement.

The buffer layer is formed to improve crystallinity and adhesiveness. The buffer layer may include a crystalline thin film that has a similar lattice constant to the MIT material layer 110. For instance, the buffer layer may be formed of one selected from a group consisting of aluminium oxide, high-k dielectric materials, crystalline metal, and silicon oxide. An aluminium oxide layer that can maintain a certain level of crystallinity is sufficient, and the silicon oxide layer is formed as thin as possible. In particular, the buffer layer may be formed in multiple layers including high-k dielectric layers with excellent crystallinity, mixture layers thereof, and/or crystalline metal layers. $TiO_2$, $ZrO_2$, $Ta_2O_5$, and $HfO_2$ layers are examples of the high-k dielectric layers.

In a device with two terminals, as the MIT material layer 110 is transformed into a metal layer, current flows in a direction horizontal to the substrate 102. Although not described in detail, the MIT material layer can be applied to a device with two terminals configured in a vertical structure, in which current flows in the direction vertical to the substrate 102.

Figure 5:
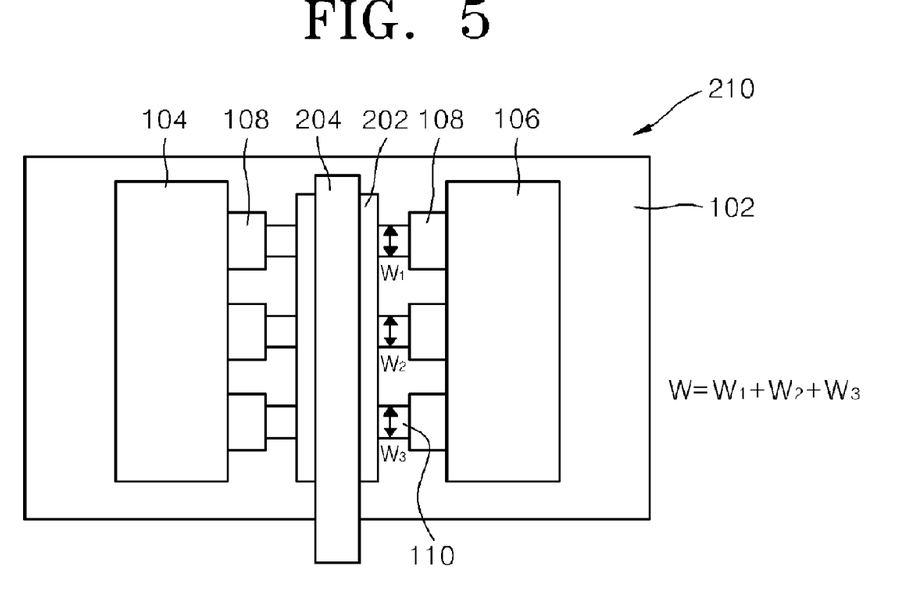
FIG. 5 illustrates a top view of an MIT device including three terminals configured in a horizontal structure, in which a gate insulator is formed on an MIT material layer, according to another embodiment of the present invention.
Figure 6:
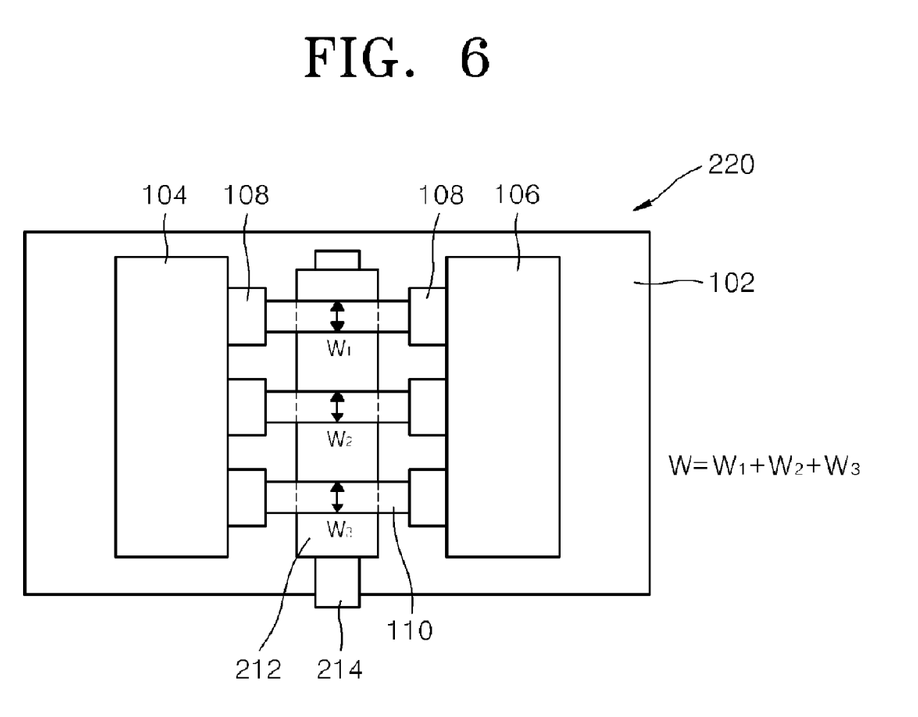
FIG. 6 illustrates a top view of an MIT device including three terminals configured in a horizontal structure, in which a gate insulator is formed below an MIT material layer, according to another embodiment of the present invention.
Figure 7:
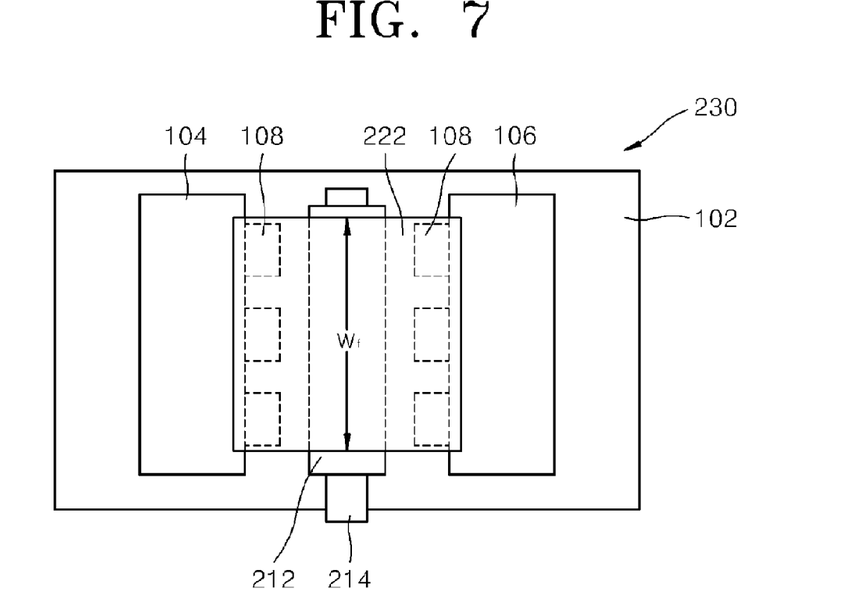
FIG. 7 illustrates a top view of an MIT device including three terminals configured in a horizontal structure, in which an MIT material layer is formed on a gate insulator, according to another embodiment of the present invention.

FIGS. 5 through 7 illustrate top views of respective MIT devices 210, 220, and 230 according to other embodiments of the present invention. Devices with three terminals configured in a horizontal structure are exemplified below in the other embodiments of the present invention. The same reference numerals represent the same elements described in FIG. 4, and thus, detailed description thereof will be omitted.

As illustrated in FIG. 5, the device with the three terminals (i.e., MIT device 210) may be configured such that a gate insulation layer 202 is disposed over MIT material layers 110, and a third electrode 204 extends over a certain region of the gate insulation layer 202. As illustrated in FIG. 6, another device with three terminals (i.e., the MIT device 220) may be configured such that a fourth electrode 214 is disposed between a substrate 102 and MIT material layers 110, and the fourth electrode extends over certain regions of the MIT material layers 110 with a gate insulation layer 212 formed between the fourth electrode 214 and the MIT material layers 110. FIG. 5 illustrates a device structure in which the third gate electrode 204 is disposed on top of the MIT material layers 110. In contrast, FIG. 6 illustrates a device structure in which the fourth gate electrode 214 is disposed underneath the MIT material layers 110.

FIG. 7 illustrates a device structure that is substantially the same as the device structure illustrated in FIG. 6 except for the shape of an MIT material layer 222. The MIT material layer 222 may be configured to cover an entire region between a first electrode 104 and a second electrode 106. The MIT material layer 222 has a width $W_f$ that allows the entire region of the MIT material layer 222 to be transformed into a metal layer due to an MIT. Unlike the MIT material layers 110 illustrated in FIGS. 5 and 6, the MIT material layer 222 is not segmented. When an electric field is applied, a conductive channel of the MIT material layer 222 is formed along a region having the shortest distance between the first electrode 104 and the second electrode 106. Thus, the device with the three terminals illustrated in FIG. 7 may operate similarly to the device with the three terminals illustrated in FIG. 5 or 6.

The gate insulation layers 202 and 212 illustrated in FIGS. 5 through 7 cover one surface region of each of the MIT material layers 110 and 222 because of the following reason. Since the MIT material layers 202 and 212 are already transformed into metal layers, as known, current flows to the surfaces of the MIT material layers 110 and 222 due to a surface effect. If necessary, an amount of current flowing to the MIT material layer 110 or 222 contacting the gate insulation layer 202 or 212 can be adjusted by covering exposed surface regions of the MIT material layer 110 or 222, e.g., upper surfaces and both side surfaces of the MIT material layers 110 illustrated in FIG. 5.

FIGS. 5 through 7 show various exemplary implementations of the device with the three terminals using the single or multiple MIT material layers according to the embodiments of the present invention. Therefore, the MIT material layers can be applicable to those devices with three terminals configured in various structures without departing from the scope and spirit of the present invention.

Figure 8:
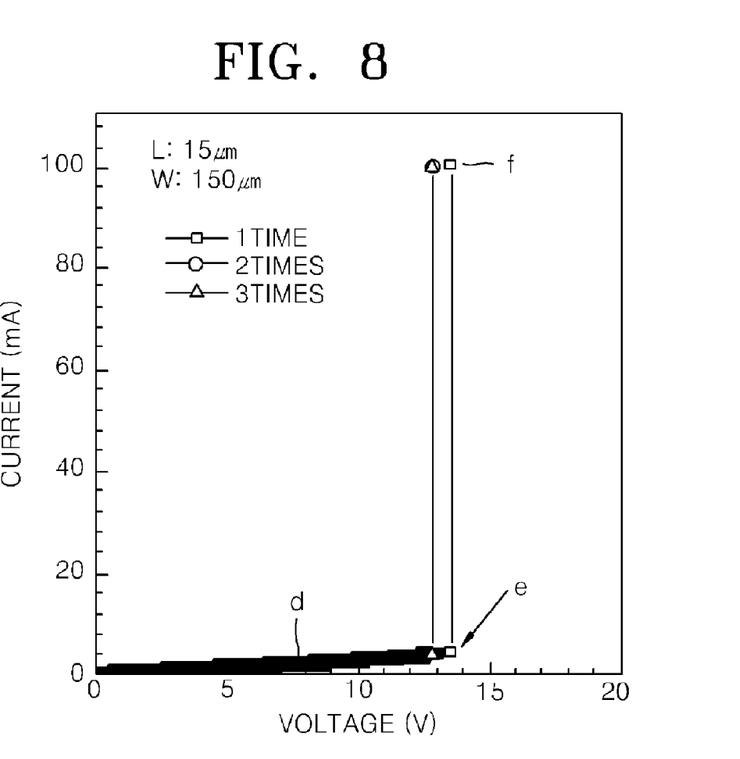
FIG. 8 illustrates a graph of current (I) versus voltage (V) applied to an MIT material layer according to an embodiment of the present invention.

FIG. 8 illustrates a graph of current (I) versus voltage (V) of an MIT material layer according to an embodiment of the present invention. The MIT material layer has a length L of approximately 15 µm. Multiple MIT material layers are formed (i.e., a segmented MIT material layer). In this embodiment, the MIT material layer is segmented into 10 regions, each having a width of approximately 10 µm, and the 10 segmented regions of the MIT material layer are connected in parallel to have a total width W of approximately 150 µm. Reference denotations □, ○, and Δ represent the number of tests performed, e.g., one time, two times and three times, respectively.

As illustrated, the MIT material layer has a critical voltage e at which an abrupt electric characteristic of the MIT material layer changes abruptly from an insulator d to a metal state f. In the present embodiment, the critical voltage of the MIT material layer when it has undergone an abrupt transition is approximately 13 V. In more detail, when the voltage of the MIT material layer is in a voltage range from approximately 0 V to 13 V, the conductive layer is in an insulator state d in which current barely flows, and when the voltage of the conductive layer is greater than approximately 13 V, the MIT material layer is in the metal state f. In other words, abruptly current jump occurs at a voltage of approximately 13 V. At this time, when the MIT material layer is in a metal state f, it contains lots of electrons. The critical voltage, i.e., the electrical characteristic of the MIT material layer, may vary depending on a device structure including an abrupt MIT material layer and the type of material layer used.

Figure 9:
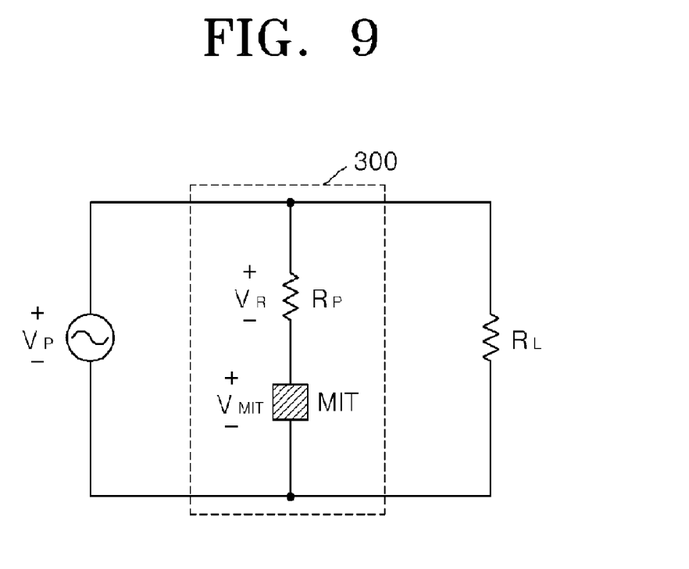
FIG. 9 is a circuit diagram illustrating a protection circuit, an equivalent load $R_L$ and a power supply voltage $V_p$ terminal according to an embodiment of the present invention.

FIG. 9 is an exemplary circuit diagram illustrating a protection circuit 300, an equivalent load $R_L$ and a power supply voltage $V_p$ terminal according to an embodiment of the present invention.

The protection circuit 300 is configured to remove static electricity applied to the equivalent load $R_L$ through a terminal to which the power supply voltage $V_p$ is supplied or to remove high voltage and high frequency noise. The protection circuit 300 is configured with an MIT device, e.g., the device with the two terminals illustrated in FIG. 4, and a protection resistor $R_p$ that are connected in series. The protection resistor $R_p$ limits a voltage or current to a certain level or amount applied to the MIT device in order to protect the MIT device.

Figure 10:
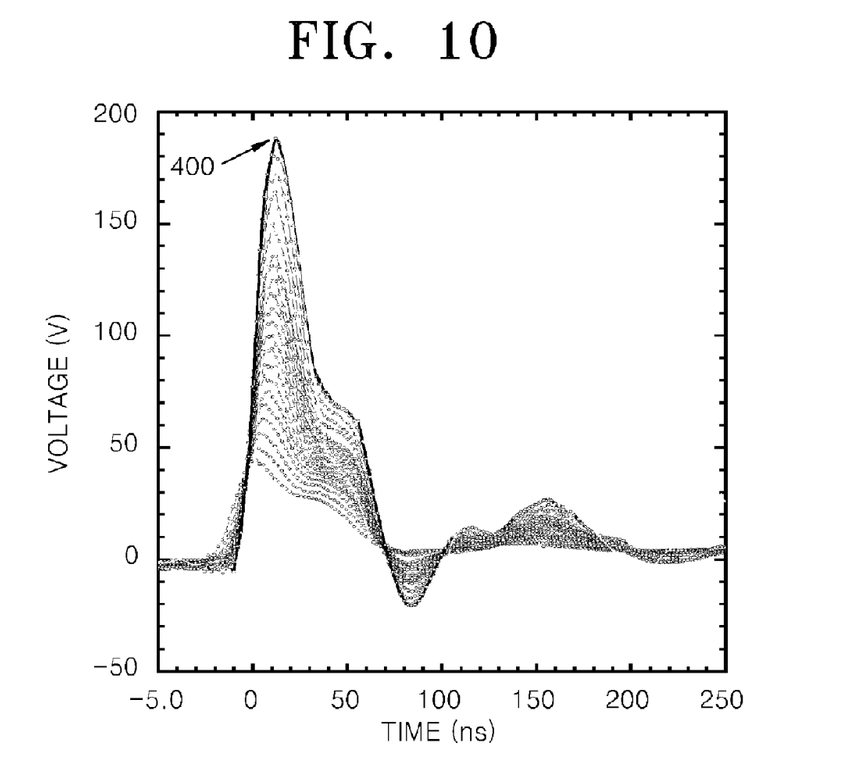
FIG. 10 illustrates a graph of voltage of an MIT device versus time for which the power supply voltage $V_p$ terminal illustrated in FIG. 9 supplies a voltage of approximately 1,500 V according to an embodiment of the present invention.

FIG. 10 illustrates a graph of voltage versus time for which power is supplied from the power supply voltage $V_p$ terminal illustrated in FIG. 9. In a voltage range from approximately 250 V to 1,000 V, a voltage of the MIT device was measured for every 50 V. In a voltage range from approximately 1,000 V to 1,500 V, the voltage of the MIT device was measured for every 100 V. The measured voltage level at each measuring point is labelled with small circles ○. The MIT material layer illustrated in FIG. 8 was used. More specifically, the MIT material layer had a length L of approximately 15 µm and a total width of approximately 150 µm attained by making a parallel connection between the 10 segmented regions of the MIT material layer, each having a width of approximately 10 µm.

As illustrated, when the power supply voltage $V_p$ terminal supplies a voltage of approximately 1,500 V for approximately $10^{-9}$ seconds, the MIT occurs at the MIT material layer. As a result, most of the current flows to the MIT material layer. Due to the resistance of the protection circuit 300, the level of residual voltage is approximately 800 V, and the remaining voltage of approximately 1320 V is supplied to the equivalent load $R_L$, namely a load resistor. However, when the voltage supplied to the load resistor $R_L$, current flows barely. Thus, damage to the load resistor $R_L$, usually caused by the power supply voltage $V_p$, can be reduced. The power supply voltage $V_p$ may be noise supplied through the terminal.

As is known in the art, the current conducting capability of the protection circuit increases as the resistance of the MIT material layer decreases. After the MIT, the MIT material layer according to the embodiments of the present invention can conduct a larger amount of current than the typical non-uniform MIT material layer including an insulator structure. Since the MIT material layer according to the embodiments of the present invention is a uniform conductor, a current flow increases to a greater extent as compared with the non-uniform MIT material layer. An appropriate parallel connection of the segmented regions of the MIT material layers allows a much larger amount of current to flow as compared with other MIT material layers.

According to the embodiments of the present invention, the abrupt MIT-based device uses at least one MIT material layer having a region that can be entirely transformed into a metal layer after the MIT. Thus, it is possible to reduce deterioration of the MIT material layer due to heat, typically generated by a large amount of current flowing through the MIT material layer.

Furthermore, connecting the multiple MIT material layers in parallel allows appropriately adjusting an amount of current flowing through the MIT material layers.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. An abrupt MIT (metal-insulator transition) device comprising:
   a plurality of MIT material layers, each having a width that allows an entire region of each of the plurality of MIT material layers to be transformed into a metal phase due to an MIT,
   wherein, taken from a plan view, two adjacent ones of the plurality of MIT material layers are separated and spaced apart from each other.

2. The abrupt MIT device of claim 1 further comprising:
   a first electrode disposed on a certain region of a substrate; and
   a second electrode disposed so as to be spaced a predetermined distance apart from the first electrode;
   wherein each of the plurality of MIT material layers electrically connects the first electrode with the second electrode.

3. The abrupt MIT device of claim 2, wherein the first electrode and the second electrode are spaced a predetermined distance from each other and partially cover both first and second sides of each of the plurality of MIT material layers.

4. The abrupt MIT device of claim 2, wherein the first electrode and the second electrode are disposed with the MIT insulator therebetween and entirely cover both first and second sides of each of the plurality of MIT material layers.

5. The abrupt MIT device of claim 1, wherein the plurality of MIT material layers are electrically connected in parallel.

6. The abrupt MIT device of claim 1, wherein each of the plurality of MIT material layers includes one selected from a group consisting of an inorganic compound semiconductor and an insulator, an organic semiconductor and an insulator, a semiconductor, and an oxide-based semiconductor and an insulator, wherein the inorganic compound semiconductor includes one selected from a group consisting of oxygen, carbon, semi-conductive elements from groups III to V or groups II to VI, transition metal elements, rare-earth elements, and lanthanum-based elements, and holes with a low doping density are added to the inorganic compound semiconductor and the insulator; and holes with a low doping density are added to the organic semiconductor and the insulator, the semiconductor, and the oxide-based semiconductor and the insulator.

7. The abrupt MIT device of claim 1, wherein current flows uniformly to the entire region of each of the plurality of MIT material layers.

8. The abrupt MIT device of claim 2, wherein each of the first electrode and the second electrode includes one selected from a group consisting of a metal group, a compound of metals selected from the metal group, and an oxide-based material including one metal from the metal group and the compound, wherein the metal group includes Li, Be, C, Na, Mg, Al, K, Ca, Sc, Ti, V, Cr, Mn, Fe, Co, Ni, Cu, Zn, Ga, Rb, Sr, Y, Zr, Nb, Mo, Tc, Ru, Rh, Pd, Ag, Cd, In, Sn, Sb, Cs, Ba, La, Hf, Ta, W, Re, Os, Ir, Pt, Au, Hg, Pb, Bi, Po, Ce, Pr, Nd, Sm, Eu, Gd, Tb, Dy, Ho, Er, Tm, Yb, Lu, Th, U, Np, and Pu.

9. The abrupt MIT device of claim 2, further comprising a protection electrode disposed between the plurality of MIT material layers and the first electrode and between the plurality of MIT material layers and the second electrode and resistant to heat generated by current flowing through the plurality of MIT material layers.

10. The abrupt MIT device of claim 9, wherein the protection electrode includes one selected from a group consisting of a metal group, a compound of metals selected from the metal group, and an oxide-based material including one metal from the metal group and the compound, wherein the metal group includes Li, Be, C, Na, Mg, Al, K, Ca, Sc, Ti, V, Cr, Mn, Fe, Co, Ni, Cu, Zn, Ga, Rb, Sr, Y, Zr, Nb, Mo, Tc, Ru, Rh, Pd, Ag, Cd, In, Sn, Sb, Cs, Ba, La, Hf, Ta, W, Re, Os, Ir, Pt, Au, Hg, Pb, Bi, Po, Ce, Pr, Nd, Sm, Eu, Gd, Tb, Dy, Ho, Er, Tm, Yb, Lu, Th, U, Np, and Pu.

11. The abrupt MIT device of claim 2, further comprising a gate electrode configured to extend over a certain region of the plurality of MIT material layers and have a gate insulation layer interposed between the plurality of MIT material layers and the gate electrode.

12. The abrupt MIT device of claim 11, wherein the gate insulation layer covers at least one surface region of each of the plurality of MIT material layers.

13. The abrupt MIT device of claim 11, further comprising a third electrode configured to extend over a certain region of the plurality of MIT material layers and have a gate insulation layer interposed between the plurality of MIT material layers and the third electrode.

14. The abrupt MIT device of claim 11, further comprising a third electrode configured to extend over the plurality of MIT material layers and have a gate insulation layer interposed between the plurality of MIT material layers and the substrate.

15. The abrupt MIT device of claim 11, further comprising a third electrode configured to extend over the conducting layer and have a gate insulation layer interposed between the conducting layer and the substrate.

16. The abrupt MIT device of claim 2, wherein the plurality of MIT material layers, the first electrode and the second electrode are configured to become parts of a protection circuit, and the abrupt MIT device further comprises an electrical system connected in parallel with the protection circuit.

17. The abrupt MIT device of claim 16, wherein the protection circuit takes in most of the current due to the abrupt MIT.

18. The abrupt MIT device of claim 16, wherein the electrical system is protected by conducting most of the current through the protection circuit.

* * * * *